United States Patent [19]

Taskar et al.

[11] Patent Number: 5,273,931
[45] Date of Patent: Dec. 28, 1993

[54] METHOD OF GROWING EPITAXIAL LAYERS OF N-DOPED II-VI SEMICONDUCTOR COMPOUNDS

[75] Inventors: Nikhil Taskar; Babar A. Khan, both of Ossining; Donald R. Dorman, Carmel, all of N.Y.

[73] Assignee: North American Philips Corporation, New York, N.Y.

[21] Appl. No.: 894,308

[22] Filed: Jun. 4, 1992

[51] Int. Cl.$^5$ .............................. H01L 21/20
[52] U.S. Cl. ...................... 437/108; 437/110; 437/106; 437/965; 437/247; 148/DIG. 64; 148/DIG. 41
[58] Field of Search .............. 437/81, 102, 103, 105, 437/106, 108, 82, 965, 110, 247; 148/DIG. 64, DIG. 41, DIG. 169

[56] References Cited

U.S. PATENT DOCUMENTS

| | | | |
|---|---|---|---|
| 4,422,888 | 12/1983 | Stutius | 437/81 |
| 4,662,981 | 5/1987 | Fujiyarsu et al. | 437/102 |
| 4,735,910 | 4/1988 | Mitsuyu et al. | 437/105 |
| 4,767,494 | 8/1988 | Kobayashi et al. | 156/606 |
| 4,904,618 | 2/1990 | Newmark | 148/DIG. 64 |
| 5,028,561 | 7/1991 | Kamath et al. | 148/DIG. 64 |
| 5,068,204 | 1/1991 | Kukimoto et al. | 437/128 |

FOREIGN PATENT DOCUMENTS 2-410751 6/1992 Japan.

OTHER PUBLICATIONS

"The Mercury Pressure Dependence of Arsenic Doping In HgCdTe, Grown by Organometallic Epitaxy (Direct Alloy Growth Process)" N. R. Taskar, J. B. Bhat, K. K. Parat, S. K. Ghandhi, Journal of Crystal Growth 110 (1991) pp. 692–696.

"Abrupt P-Type Doping Profile of Carbon Atomic Layer Doped GaAs Grown by Flow-Rate Modulation Epitaxy" Naoki Kobayashi, Toshiki Makimoto and Yoshiji Horikoshi, Appl. Phys Lett. 50 (20), 18 May 1987, pp. 1435–1437.

"Efficient Si Planar Doping In GaAs by Flow-Rate Modulation Epitaxy" Naoki Kobayashi, Toshiki Makimoto and Yoshiji Horikoshi, Jpn. J. Appl. Phys. vol. 25, No. 9, Sep., 1986, pp. L746-L-748.

Primary Examiner—Brian E. Hearn
Assistant Examiner—Tuan Nguyen
Attorney, Agent, or Firm—John C. Fox

[57] ABSTRACT

Epitaxial layers of N-doped II-VI semiconductor compounds are grown on GaAs substrates by MOCVD using FME. Separating the growth and doping by alternating introduction of (1) the semiconductor cation and anion and (2) the cation and the dopant increases the level of doping, the level of activation, and the crystal quality.

10 Claims, 4 Drawing Sheets

METHOD OF GROWING EPITAXIAL LAYERS OF N-DOPED II-VI SEMICONDUCTOR COMPOUNDS

BACKGROUND OF THE INVENTION

This invention relates to epitaxial layers of II-VI semiconductor compounds doped with nitrogen, and more particularly relates to a method of producing such layers having improved dopant concentration and improved crystallinity.

As is known, semiconductors are characterized as either n-type or p-type, depending upon whether the predominant carriers in the material are electrons or holes. As is also known, semiconductors can be rendered n-type or p-type by substituting impurity atoms (dopants) for atoms of the host lattice which have a different valence. Donor-type impurities are those which give electrons, and thus render the host material n-type, while acceptor-type impurities are those which receive electrons, and thus render the host p-type.

Successful doping to obtain or enhance n-type or p-type conductivity depends not only on the ability to introduce a sufficient amount of the proper dopant into the semiconductor material, but also upon the ability to position the dopant atoms in the proper substitutional sites within the material's crystal lattice where they can give or receive electrons.

Dopants which do not readily assume the proper substitutional sites in sufficient number can be activated, i.e., converted to donors or acceptors, e.g., by a thermal anneal of the doped semiconductor material.

Another important consideration is the presence of other impurities in the semiconductor material which are, or are capable of assuming, an opposite conductivity type than that intended, thus compensating the effect of the dopant. Thus, it is actually the net donor or acceptor concentration which determines the overall conductivity of the material.

Semiconductors which can easily be rendered n-type or p-type, such as Si. from Group IVA of the Periodic Table, and GaAs, a III-V compound, so-called because it is made up of elements from Groups IIIA and VA of the Periodic Table, can be converted to devices such as diodes by doping adjacent regions p- and n-type to form pn junctions.

II-VI compounds such as ZnS and ZnSe are of interest for such devices because of their relatively wide band gaps. For example, being able to form a doped junction in an epitaxial layer of ZnSe could result in a blue-emitting LED or laser.

However, in practice, it has proved extremely difficult to obtain stable p-type ZnSe epitaxial layers. While a sufficient amount of dopant can usually be introduced into the layers, it is either difficult to convert sufficient numbers of the dopant atoms into acceptors, or the acceptors are unstable. For example, lithium-doped epitaxial layers of ZnSe can be converted to p-type material (defined herein as a material having a net acceptor concentration greater than $1 \times 10^{14}$ acceptors or holes per cc)., but lithium is unstable because of its tendency to diffuse, even at relatively low temperatures.

Nitrogen would be a more stable acceptor than lithium, and can be doped into ZnSe in situ in high concentrations ($10^{19}$/cc) using metal organic chemical vapor deposition (MOCVD). However, only a small fraction of it (up to $1 \times 10^{14}$/cc) can be activated.

Greater success has been achieved using chemical beam epitaxy (CBE). That is, starting with an as-grown dopant concentration of about $10^{19}$, a net acceptor concentration in the range of $10^{16}$ to $10^{17}$ has been achieved. However, the technique requires relatively expensive equipment and the conversion efficiency is relatively low.

A problem encountered in the MOCVD of N-doped ZnSe using $NH_3$ as the dopant species is the limitation in the active acceptor concentration achievable due to the relative stability of $NH_3$ at the growth temperature. $NH_3$ is expected to decompose into $NH_2, NH \ldots (NH_x)$ with each subsequent species being present in decreasing concentration. Also the possibility of $H_xN-NH_x$ dimer formation is likely. Increasing the decomposition of $NH_3$ by using higher growth temperatures results in a decrease in the sticking coefficient of these species on the growth surface. Active Nitrogen acceptor is incorporated when the $H_x$ from the $NH_x$ species which arrive at the surface is removed, possibly due to the attraction of $CH_3$ from the metalorganic (MO) species. Attempts to increase the concentration of $NH_x$ by increasing the flow of $NH_3$ in the growth chamber results in the degradation of crystal quality of the epi layer, probably due to $NH_3$ reacting with the Se MO precursor.

Dopants are usually activated by a carefully controlled thermal treatment such as a furnace anneal, which allows the dopant ions to relax into the correct substitutional sites in the host lattice, and/or results in the removal of a species, such as H, which tends to passivate the dopant.

Unfortunately, such annealing, while necessary to achieve activation, often results in degradation of the epi layer, for example, by interdiffusion across the boundary surfaces of the layer.

Rapid thermal annealing has been employed in combination with a diffusion-limiting capping layer, in order to minimize degradation of the epi layer during activation. See commonly assigned copending U.S. patent application Ser. No. 851,452, filed Mar. 16, 1992.

However, it would be preferable to produce a highly doped epi layer having a greater proportion of the dopant in an active or nearly active condition, so that subsequent activation by annealing could be carried out at lower temperatures, for shorter times, or both, to achieve the same or even greater amounts of activation, with less degradation of the epi layer.

OBJECTS AND SUMMARY OF THE INVENTION

Accordingly, it is an object of the invention to produce highly doped epitaxial layers of II-VI semiconductor compounds in which the proportion of the dopant in an active or nearly active condition is improved.

It is another object of the invention to produce such layers in which the crystallinity of such doped epi layers is improved.

In accordance with the invention, such doped layers are produced by metalorganic chemical vapor deposition (MOCVD) using the technique of flow modulation epitaxy (FME) and using nitrogen (N) as the dopant and ammonia ($NH_3$) as the dopant growth species.

As used herein, the term FME means the growth of an epi layer by the introduction into the growth chamber of one or more of the growth species at timed intervals, rather than introducing all of the species simultaneously. As used herein, the term growth species means a compound or intermediate of a cation or anion of the II-VI compound, or the dopant ion, which species decomposes or disassociates thermally or chemically during growth to yield the ion.

In accordance with the invention, it has been discovered that the proportion of dopant in an active or nearly active state in an as-grown epi layer of a II-VI semiconductor compound, as well as the crystallinity of the layer, can be improved by separating the growth and doping processes. Accordingly, in its broadest aspects, the invention comprises growing a doped epi layer of a II-VI semiconductor compound, such as ZnSe, by FME, in which the anion growth species and $NH_3$, are introduced alternately at timed intervals, so that substantially either one or the other, but not both, are present in the growth chamber at any time, and in which the cation species is substantially always present in the growth chamber with the $NH_3$.

In a preferred embodiment of the invention, the anion species is present substantially alone in the growth chamber for a timed interval before the cation species and the $NH_3$ are introduced, so that the growth surface is substantially devoid of the cation during the doping interval.

While not completely understood, and therefor not relied upon to define the invention, the following explanation is offered as an aid to understanding the benefits of the above procedure, which are thought to be responsible for the improved results.

The relative stability of $NH_3$ as a growth species has the disadvantage that H can be incorporated as an impurity into the crystal lattice, where it can interfere with activation of the N ions. Even if a N ion is located in a proper substitutional site, an adjacent interstitial H can prevent the N from performing its intended function as an acceptor.

It is thought that introducing the $NH_3$ with the cation species results in a weak association of the cation with the N, thus aiding in both the dissociation of $NH_3$ and the proper incorporation of N into the lattice. If the anion species were present, it would interfere with this association of the cation and the N. On the other hand, the presence of the anion alone on the growth surface tends to attract the cation and its associated N, allowing incorporation of the cation into the II sublattice, and the N into the VI sublattice.

In accordance with another preferred embodiment, the epi layer is grown in an FME sequence starting with the introduction of the cation or anion species alone into the growth chamber, to form cations or anions on the substrate to stabilize the growth surface, followed by the introduction of the anion species with the cation species, to form a layer of the semiconductor compound, followed by removal of the cation species from the growth chamber, to form a layer of anions on the growth surface, followed by removal of the anion species and co-introduction of the cation species and the $NH_3$, to form a layer of cations and dopant. Except for the initial introduction of the cation or anion species to stabilize the surface, the sequence is repeated to build up an epi layer of the desired thickness.

BRIEF DESCRIPTION OF THE DRAWING

The invention will now be described in terms of a limited number of embodiments in connection with the accompanying drawing, in which.

DESCRIPTION OF THE PREFERRED EMBODIMENTS

Figure 1:
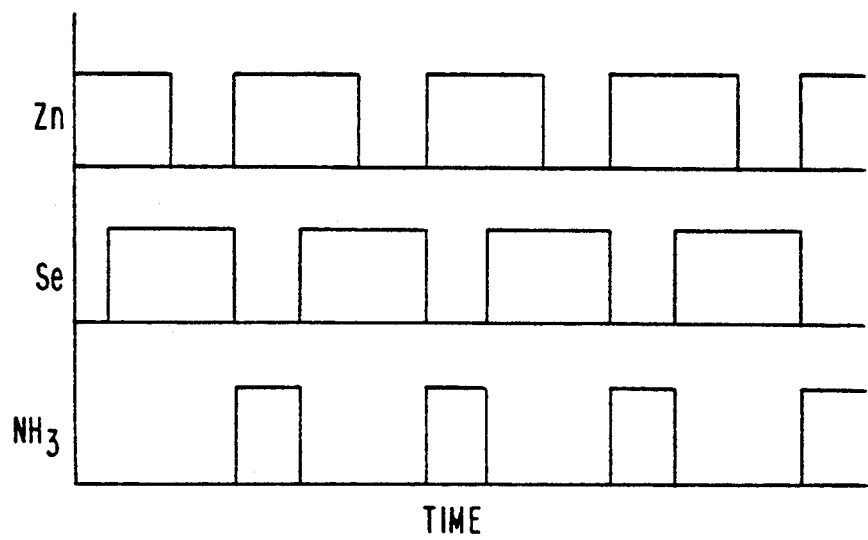
FIG. 1 shows a typical pulse sequence for the FME growth of an epi layer in accordance with the method of the invention.

Referring now to FIG. 1, a schematic diagram illustrating a typical pulse sequence for the FME growth by MOCVD of an epi layer in accordance with the method of the invention, flow rate of the growth species in the growth chamber is represented on the y axis in arbitrary units for each of three growth species, while pulse time is represented on the x axis. Typical growth species for an N-doped ZnSe layer are dimethyl zinc (DMZn), dimethyl selenium (DMSe) and ammonia ($NH_3$) Other growth species which may be used are diethyl (DE), diisopropyl (DIP) Zn or Se, or $H_2Se$. As is known, dissociation of DM and DE species must be photoassisted.

It will be readily appreciated that for given flow rates, the thickness of the various layers can be controlled by the pulse duration. The dopant concentration can also be controlled in this manner, up to the point at which the growth surface becomes saturated with dopant. The dopant concentration can also be controlled by changing the thickness of the ZnSe layer between the dopant pulses (for a constant dopant pulse duration). In FIG. 1, the doping pulse is indicated as Td. For typical growth conditions, i.e., growth on a GaAs substrate at a temperature of from about 325 to 450 degrees C., at flow rates of about 0.25 sccm to 2.00 ccm for the DMZn and DMSe and 25 sccm for the $NH_3$, Td could range from 0.05 to 0.6 minutes, while saturation could begin to occur at about 0.2 minutes. The ZnSe growth pulse, indicated as Tg, could range from 0.05 to 0.6 minutes, while the so-called Se stabilization pulse, Tse, could range from 0.05 to 0.15 minute.

The actual growth temperature chosen is dictated by a compromise between growth time (longer at lower temperatures), dopant dissociation (lower at lower temperatures) and sticking coefficient (lower at higher temperatures). A preferred temperature based on these considerations is about 350 ($\pm$5) degrees C. The thickness of the individual sublayers can range from a fraction of a monolayer to a monolayer, usually a monolayer, for the initial cation or anion stabilizing layer, and from a few monolayers up to several hundred angstroms for the growth layer. Generally, for a single growth species, an equilibrum between adsorption and desorption limits its coverage to a maximum of one monolayer. The maximum thickness of the growth layers (e.g., ZnSe) is determined by the level of doping desired (e.g., several hundred Angstroms for $10^{16}$/cc but only about 50 Angstroms for $10^{18}$/cc). Making the growth layers too thick results in uneven distribution of the dopant in the final epi layer.

In order to illustrate the advantages of the invention, several epi layers of ZnSe on GaAs were produced by MOCVD, and PL spectra were obtained. A first layer was grown in accordance with the teachings of the prior art by introducing the DMZn, DMSe and $NH_3$ together throughout growth. Second and third layers were grown by FME. In the second layer, $NH_3$ was pulsed without DMZn, while in the third layer, NH$_3$ and DMZn were pulsed together.

In the second layer, the surface was stabilized with DMZn before introducing NH$_3$. In the third layer the surface was stabilized with DMSe prior to introducing NH$_3$ and DMZn. Growth conditions for each of these three layers were as follows:

Growth temperature=375 C.;
DMZN, DMSe, flow rate 0.5 sccm;
NH$_3$ flow rate −25 sccm;

FME Layers

Growth pulse, 0.15 min.
Stabilization pulse, 0.15 min.
Doping pulse, 0.30 min.

Figure 2:
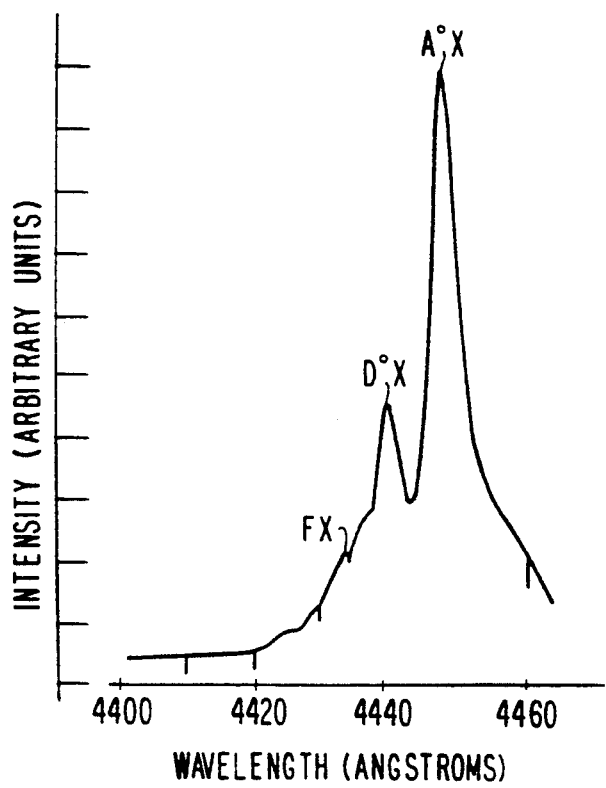
FIGS. 2 through 4 are photoluminescense (PL) spectra for epi layers of ZnSe doped with N grown by MOCVD under different conditions in order to illustrate the advantages of the inventive method.
Figure 3:
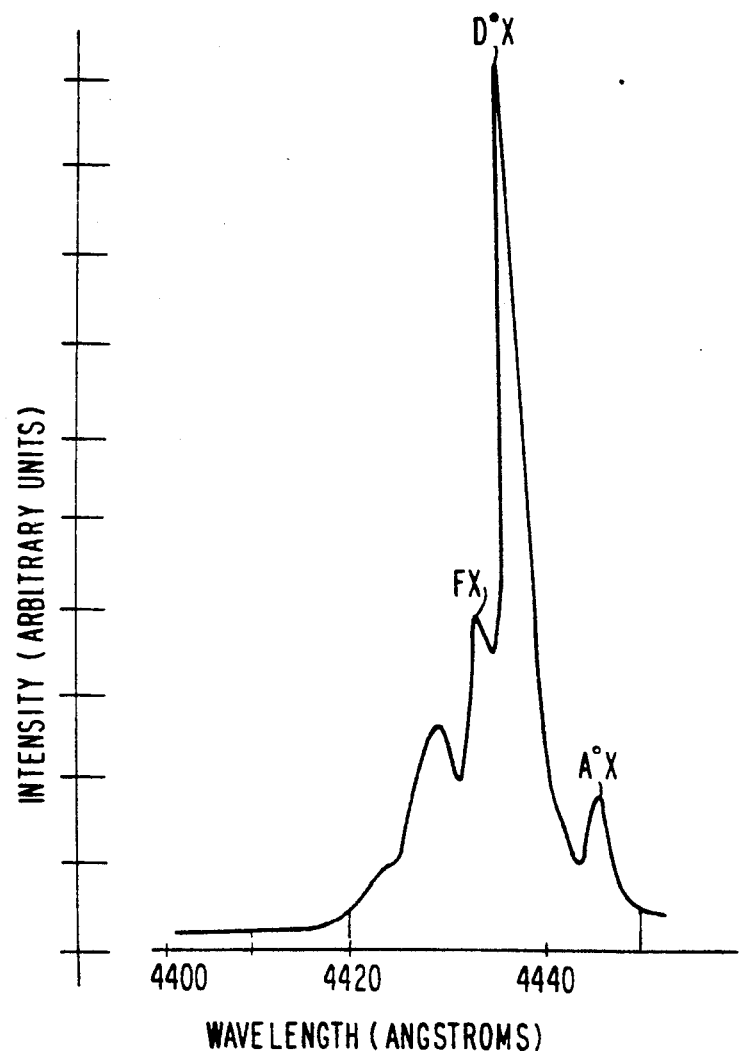
Figure 4:
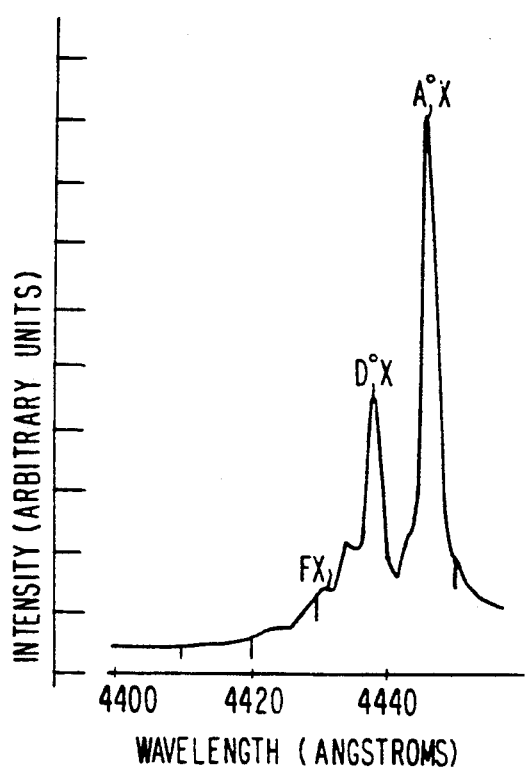

The PL spectra for these three layers are shown in FIGS. 2-4, respectively, in which wavelength in angstroms is plotted on the x axis and luminescent intensity in arbitrary units is plotted on the y axis. In these spectra, the peaks labeled Aox indicate the presence of N acceptors, while the relative height of the A$^o$x peaks with respect to the peak labeled Fx indicate the concentration of activated N acceptors. A comparison of FIGS. 2 and 4 shows that the method of the invention (FIG. 4) results in a higher incorporation of acceptors, and higher activation level, indicated by an Aox/Fx ratio higher by a factor of about 2.

Comparing FIGS. 3 and 4 shows that introducing the NH$_3$ with DMZn in accordance with the invention instead of alone (or with DMSe) is essential to enhance both the incorporation and activation of N acceptors.

The crystal quality of the layer of the invention is also improved over that of the prior art, as indicated by the greater widths of the peaks in the PL spectrum of FIG. 2.

Layers produced in accordance with the invention will benefit from the rapid thermal anneal described and claimed in the above-mentioned copending U.S. application Ser. No. 851,452, incorporated herein by reference. When subjected to such an anneal, samples have exhibited net acceptor concentrations Na—Nd in the range of about $5 \times 10^{15}$ to $3 \times 10^{16}$, for doping levels of $3 \times 10^{17}$ cm$^{-3}$ and $1 \times 10^{18}$/cc, respectively, as measured by the CV technique described in said application.

The FME grown layer (third layer) shows a higher activation of acceptors at lower annealing temperatures, compared to the regular doped layer (first layer) for the same amount of Nitrogen incorporated in the crystal. For example, when annealed at 700 C. for 10 sec., the values of N$_a$—N$_d$ are $1 \times 10^{15}$ and $2 \times 10^{16}$/cc, for the first and third layers, respectively, for a common doping level of $1 \times 10^{18}$/cc.

We claim:

1. A method of growing a N-doped epitaxial layer of a II-IV semiconductor compound of at least one Group IIA cation and at least one Group VI anion, the method comprising vapor depositing the cation and anion from metalorganic growth species and the dopant from ammonia onto a single crystal substrate in a growth chamber;

characterized in that the anion growth species and NH$_3$ are introduced alternately at timed intervals, so that substantially either one or the other, but not both, are present in the growth chamber at any time, and in which the cation species is substantially always present in the growth chamber with the NH$_3$.

2. The method of claim 1 in which the anion species is present substantially alone in the growth chamber for a timed interval before the cation species and the NH$_3$ are introduced, so that the growth surface is substantially devoid of the cation during the doping interval.

3. The method of claim 2 in which the layer is grown in an FME sequence comprising repeating growth cycles to build up an epi layer of the desired thickness, each cycle comprising: introducing the anion species with the cation species, to form a layer of the semiconductor compound, followed by removal of the cation species from the growth chamber, to form a layer of anions on the growth surface, followed by removal of the anion species and co-introduction of the cation species and the NH$_3$, to form a layer of cations and dopant.

4. The method of claim 3 in which the initial growth cycle is proceeded by the introduction of the cation or anion species to stabilize the growth surface.

5. The method of claim 1 in which the compound is ZnSe.

6. The method of claim 5 in which the growth is carried out at a temperature of about 325 to 450 degrees C.

7. The method of claim 1 in which the cation and anion growth species are selected from the group consisting of dimethyl, diethyl and diisopropyl compounds and H$_2$Se.

8. The method of claim 1 in which the substrate is GaAs.

9. The method of claim 1 in which the epitaxial layer is thermally annealed following growth.

10. The method of claim 9 in which the anneal is a rapid thermal anneal.

* * * * *